(12) United States Patent
Yang et al.

(10) Patent No.: US 8,803,322 B2
(45) Date of Patent: Aug. 12, 2014

(54) THROUGH SUBSTRATE VIA STRUCTURES AND METHODS OF FORMING THE SAME

(75) Inventors: Ku-Feng Yang, Dali (TW); Tsang-Jiuh Wu, Hsinchu (TW); Yi-Hsiu Chen, Hsinchu (TW); Ebin Liao, Xinzhu (TW); Yuan-Hung Liu, Hsinchu (TW); Wen-Chih Chiou, Miaoli (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/272,506

(22) Filed: Oct. 13, 2011

(65) Prior Publication Data

US 2013/0093098 A1 Apr. 18, 2013

(51) Int. Cl.
*H01L 23/48* (2006.01)

(52) U.S. Cl.
USPC .... 257/774; 257/686; 257/777; 257/E23.011; 438/637; 438/638; 438/675

(58) Field of Classification Search
USPC .......... 257/774, 686, 777, E21.011, 782, 784, 257/E23.011; 438/637–640, 672, 675
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 * | 3/2007 | Matsui .......................... 257/686 |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 8,580,682 B2 * | 11/2013 | Yang et al. .................... 438/667 |

(Continued)

*Primary Examiner* — Cheung Lee
*Assistant Examiner* — Stephen Bradley
(74) *Attorney, Agent, or Firm* — Lowe Hauptman & Ham, LLP

(57) ABSTRACT

The embodiments of forming a through substrate via (TSV) structure described enable reducing risk of damaging gate structures due to over polishing of an inter-level dielectric layer (ILD) layer. The TSV structure with a wider opening near one end also enables better gapfill.

20 Claims, 3 Drawing Sheets

(56) References Cited

U.S. PATENT DOCUMENTS

| | | | |
|---|---|---|---|
| 2005/0104219 A1* | 5/2005 | Matsui | 257/774 |
| 2009/0160030 A1* | 6/2009 | Tuttle | 257/621 |
| 2009/0278237 A1* | 11/2009 | Cooney et al. | 257/621 |
| 2010/0323478 A1* | 12/2010 | Kuo | 438/124 |
| 2011/0318923 A1* | 12/2011 | Park et al. | 438/675 |
| 2012/0032340 A1* | 2/2012 | Choi et al. | 257/774 |
| 2012/0056328 A1* | 3/2012 | Lai et al. | 257/774 |
| 2012/0261827 A1* | 10/2012 | Yu et al. | 257/774 |

* cited by examiner

US 8,803,322 B2

THROUGH SUBSTRATE VIA STRUCTURES AND METHODS OF FORMING THE SAME

TECHNICAL FIELD

The present disclosure relates generally to the field of semiconductor and, more particularly, to semiconductor structures and methods of forming the same.

BACKGROUND

Since the invention of the integrated circuit, the semiconductor industry has experienced continual rapid growth due to continuous improvements in the integration density of various electronic components (i.e., transistors, diodes, resistors, capacitors, etc.). For the most part, this improvement in integration density has come from repeated reductions in minimum feature size, allowing for the integration of more components into a given area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limits to the density that can be achieved in two dimensions. One of these limits is the minimum size needed to make these components. Also, when more devices are put into one chip, more complex designs are required.

Three-dimensional integrated circuits (3D IC) have been therefore created to resolve the above-discussed limitations. In some formation processes of 3D ICs, two wafers, each including an integrated circuit, are formed. The wafers are then bonded with the devices aligned. Deep vias are then formed to interconnect devices on the first and second wafers.

Recently, through-silicon-vias (TSVs), also referred to as through-substrate-vias or through-wafer vias, are increasingly used as a way of implementing 3D ICs. Generally, a bottom wafer is bonded to a top wafer. TSVs are often used in 3D ICs and stacked dies to provide electrical connections and/or to assist in heat dissipation. There are challenges in forming TSVs in 3D ICs and stacked dies.

BRIEF DESCRIPTION OF THE DRAWINGS

The present disclosure is understood from the following detailed description when read with the accompanying figures. It is noted that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION OF THE DISCLOSURE

Figure 1:
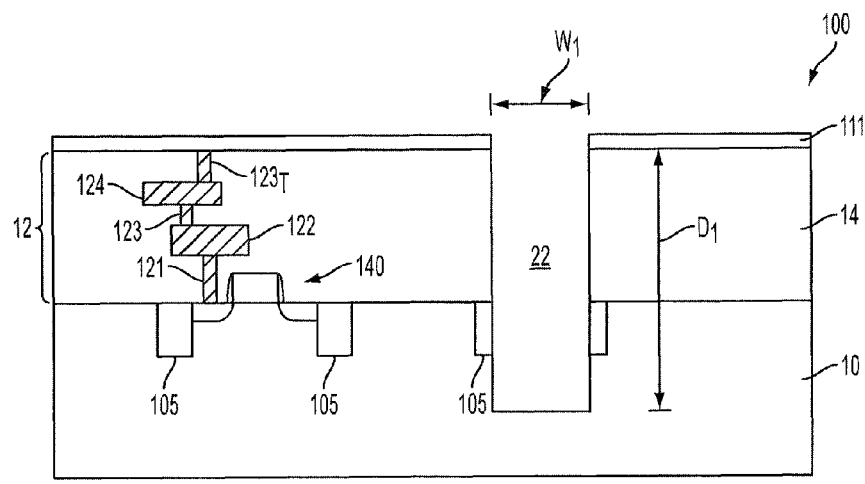
FIGS. 1-4 are schematic cross-sectional views of a semiconductor structure during various fabrication stages, in accordance with some embodiments.

A method of forming a TSV structure that is known to the applicants includes forming an interlayer dielectric (ILD) layer over a substrate. A TSV opening is patterned through the ILD layer and into the substrate. An oxide liner and one or more conductive materials are sequentially deposited over the ILD layer to fill the TSV opening. The substrate is then subjected to a chemical mechanical polish (CMP) process, such that the excess oxide liner and the TSV metallic material that are over the ILD layer are removed. During the CMP process, the ILD layer may also be removed. Excessive loss of the ILD layer could damage the gate structures embedded in the ILD layer. Such issue could worsen for advanced technology nodes due to reduced average thickness of the ILD and a tighter process window. As a result, alternative mechanisms for forming TSV structures in a substrate are sought to resolve such issues.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIGS. 1-4 are schematic cross-sectional views of a semiconductor structure during various fabrication stages, in accordance with some embodiments. Items in FIGS. 1-4 that are the same or similar are indicated by the same reference numerals. It is understood that FIGS. 1-4 have been simplified for a better understanding of the concepts of the present disclosure. Accordingly, it should be noted that additional processes may be provided before, during, and after processes described in FIGS. 1-4, and that some other processes may only be briefly described herein.

FIG. 1 is a schematic cross-sectional view of a structure 100, in accordance with some embodiments. Structure 100 is formed on substrate 10. In some embodiments, substrate 10 may include an elementary semiconductor including silicon or germanium in a crystalline, a polycrystalline, or an amorphous structure; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof. In at least one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

In some embodiments, isolation structures 105 are formed in substrate 10 as shown in FIG. 1. The isolation structure 105 may be a shallow trench isolation (STI) structure, a local oxidation of silicon (LOCOS) structure, and/or any combinations thereof. The isolation structures 105 may be made of at least one material, such as silicon oxide, silicon nitride, silicon oxynitride, other dielectric materials, and/or any combinations thereof.

In some embodiments, structure 100 may include various passive and active microelectronic devices, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, FinFET transistors, other types of transistors, and/or any combinations thereof. Structure 100 can be part of an interposer, which can be configured to provide an electrical connection in a 3-dimensional (3-D) package system. Interposers with active devices may be referred to as active interposers. Interposers without active devices may be referred to as passive interposers.

For example, structure 100 includes at least one transistor, e.g., a transistor 140 that is disposed over the substrate 10 as shown in FIG. 1. Transistor 140 is electrically coupled with an interconnect structure 12. Interconnect structure 12 includes metal lines and vias formed in dielectric layers 14. The interconnect structure 12 includes metal layers stacked layer by layer, with metal lines formed in the metallization layers, and contacts/vias connecting the first metal layer (M1) to device structure or metal lines in neighboring layers. FIG. 1 shows that interconnect structure 12 may include a contact plug 121 connecting M1 layer 122 to transistor 140. FIG. 1 also show that the interconnect structure 12 include additional metal layers (Mx) 124 and vias 123. The number, X, of metal layers ($M_X$) in interconnect structure 12 may vary and it depends on the application and technology involved. For example, the number of metal layers can be 8 or more layers for some ICs. The number of via layers depends on the number of metal layers.

Dielectric layers 14 may be made of various dielectric materials, such as low-k dielectric layers having dielectric constants (k values) less than about 3.5. In some embodiments, the dielectric layers 14 include an extreme low-k dielectric layer having k values less than about 2.5. The dielectric material surrounding the contact plug 121 can be made of at least one material, such as silicon oxide, e.g., undoped silicate glass (USG), boron-doped silicate glass (BSG), phosphor-doped silicate glass (PSG), boron-phosphor-doped silicate glass (BPSG), or the like, silicon oxynitride, silicon nitride, a low-k material, and/or any combinations thereof. In some embodiments, a multiple-layer dielectric may be used. The formation methods may include chemical vapor deposition (CVD), plasma-enhanced CVD (or PECVD), spin-on, and other applicable methods.

After a top via $123_T$ is formed, the substrate is deposited with an etch stop layer 111 over the surface of the dielectric layers 14, in accordance with some embodiments. In some embodiments, the thickness of the dielectric layer 111 is in a range from about 100 angstroms (Å) to about 1000 Å. In some embodiments, the etch stop layer 111 includes more than one sub-layer. The etch stop layer 111 should have good etch selectivity relative to dielectric layers 14 and substrate 10. The etch stop layer may be made of silicon nitride, silicon oxynitride, silicon carbide, or any combinations thereof. The formation methods may include chemical vapor deposition (CVD), plasma-enhanced CVD (or PECVD), and other applicable methods.

After the etch stop layer 111 is deposited, the substrate is patterned and etched to form a TSV opening 22, which extends into the semiconductor substrate 10. A photoresist layer (not shown) may be deposited on the substrate surface and patterned by a lithographical process to define the TSV opening 22, in some embodiments. Other patterning materials may also be used. The patterned photoresist layer is then used as an etch mask. One or more etching processes are then used to remove the dielectric layers 14 and a portion of substrate 10 to form the TSV opening 22. The width of opening 22, $W_1$, is in a range from about 1 μm to about 20 μm, in accordance with some embodiments. The depth of opening 22, $D_1$, is in a range from about 5 μm to about 200 μm, in accordance with some embodiments. In some embodiments, the etch stop layer is optional.

Figure 2:
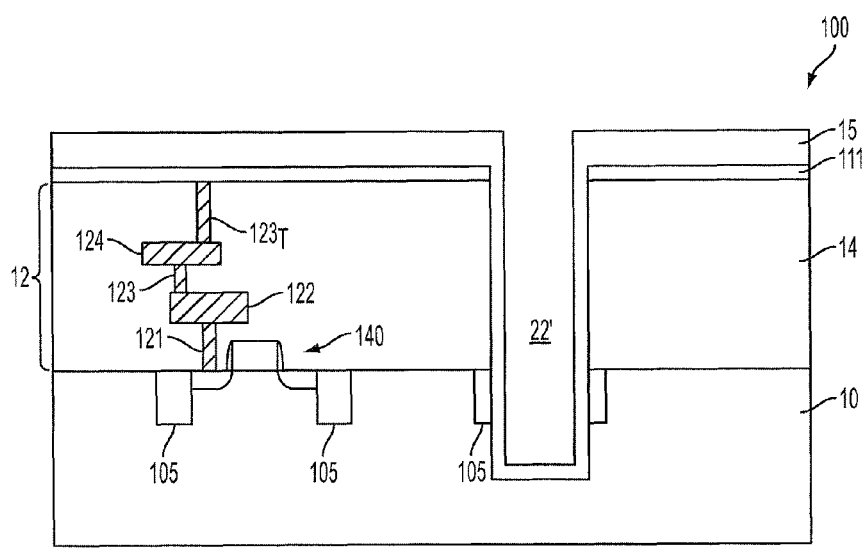
Figure 3:
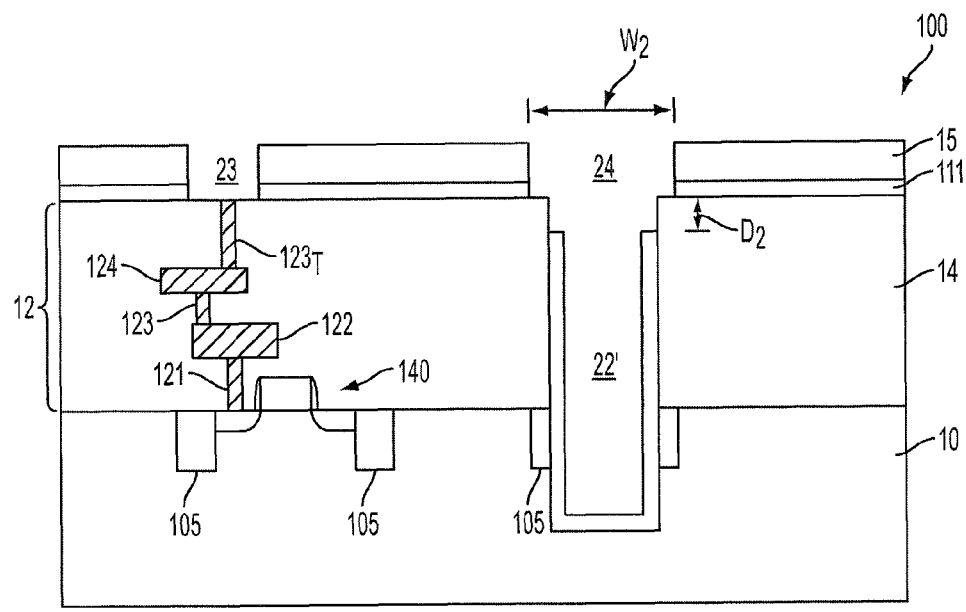

After the TSV opening 22 is formed, a dielectric (ILD) layer 15 is formed over substrate 10 to cover the etch stop layer 111 and the TSV opening 22, as shown in FIG. 2 in some embodiments. The dielectric layer may be made of an undoped silicate glass (USG), a low-k material, or a polymeric dielectric, such as polyimide. In some embodiments, the k value of the dielectric layer 15 is greater than about 3.5. The thickness of dielectric layer 15 is in a range from about 1000 Å to about 30,000 Å (or 3 μm). The formation methods may include chemical vapor deposition (CVD), plasma-enhanced CVD (or PECVD), spin-on, and other applicable methods. Dielectric layer 15 completely covers the side walls for TSV opening 22. In some embodiments, the minimum thickness of dielectric layer 15 on side walls of TSV opening 22 is equal to or greater than about 1000 Å. The deposited dielectric layer 15 lines the side wall(s) of TSV opening 22. As a result, the TSV opening 22 is narrowed to become TSV opening 22'.

Afterwards, the dielectric layer 15 is patterned and etched to form an opening 23 and an upper opening 24 of TSV at the top of opening 22'. The opening 23 is for forming an upper metal layer (or metal structure), which is not the $M_1$ layer (or layer 122), and may be $M_2, M_3, \ldots, M_{TOP}$ (or top metal layer) As a result, the dielectric layer 15 is an inter-level dielectric (ILD) layer, which also may be called an inter-metal dielectric (IMD) layer. A photoresist layer (not shown) may be deposited and patterned to form an etch mask, which is then etched to form openings 23 and 24. The patterning and/or etching processes also remove any photoresist inside the opening 22'. During the formation of openings 23 and 24, the etch stop layer 111 is removed to expose via 123. In some embodiments, upper opening 24 of TSV is wider than opening 22'. Wider opening 24 enables better gap-fill of conductive material(s) in the TSV openings (24 and 22'). The width of the TSV opening 24, $W_2$, is in a range from about 1 μm to about 20 μm, in accordance with some embodiments. In some embodiments, the opening 24 is wider than the opening 22' by a width ($W_2-W_1$) in a range from about 2000 Å to about 60,000 Å (or 6 μm), in accordance with some embodiments. The depth of opening 24, $D_2$, is in a range from about 2000 Å to about 20000 Å, in accordance with some embodiments.

Figure 4:
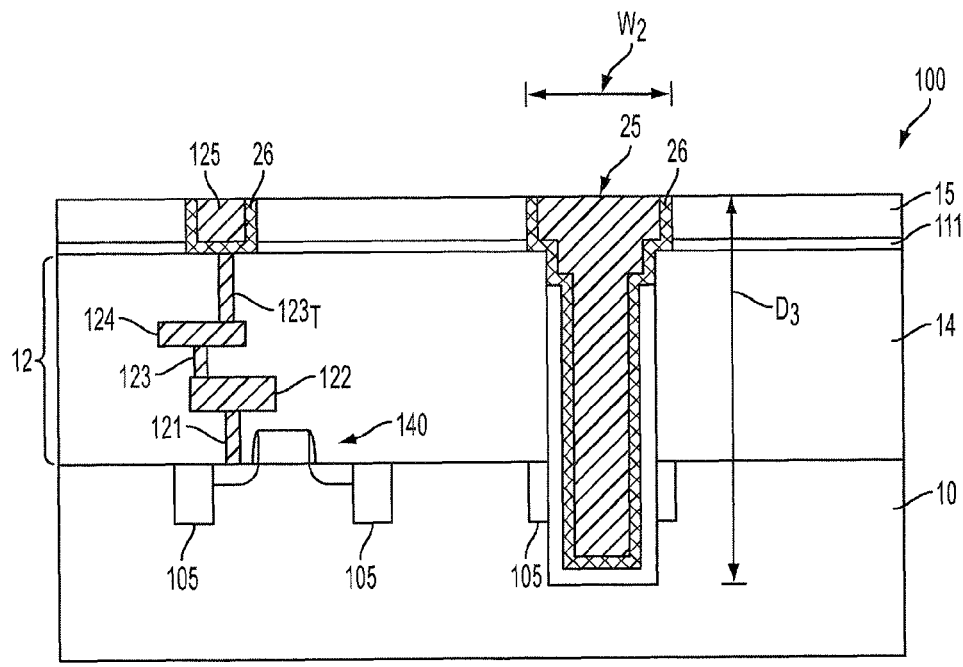

After openings are formed, as is shown in FIG. 4, a conductive material layer (or a gap-fill layer) 30 is deposited on the resultant structure to fill opening 23 and the TSV openings 24 and 22', in some embodiments. The excess (or undesirable) conductive material layer 30 outside the openings 23, 24, and 22' are removed. In some embodiments, the excess conductive material(s) is removed by chemical-mechanical polishing (CMP). The processes described above result in a metal layer (or a metal interconnect) 125 and a TSV 25. Since metal layer 125 is not a M1 layer, the risk of over polishing by the CMP process, which could result in excessive loss of the ILD layer to damage the gate structures embedded in the ILD layer, is reduced. The depth of TSV 25, $D_3$, is in a range from about 5 μm to about 200 μm, in accordance with some embodiments.

In some embodiments, the conductive material layer 30 includes copper or copper alloys. Other metals, such as aluminum, silver, gold, titanium, titanium, and combinations thereof, may also be used. The formation methods may include sputtering, printing, electro plating, electroless plating, and commonly used chemical vapor deposition (CVD) methods. At the time the TSV openings 24 and 22' are filled with the conductive material layer 30, the same conductive material is also formed in opening 23.

In an embodiment of forming the conductive layer 30, a copper seed layer may also be formed of PVD, sputtering or plating, and then plating copper to fill the desirable regions. Before forming the copper seed layer and the copper layer, a diffusion barrier layer 26 may be blanket deposited, covering the exposed portions. The diffusion barrier layer may include barrier materials such as titanium, titanium nitride, tantalum, tantalum nitride, and combinations thereof. In some embodiments, the barrier metallic material is substantially conformal in the TSV opening(s). The barrier metallic material can be formed by, for example, CVD, physical vapor deposition (PVD), atomic layer deposition (ALD), and/or other suitable processes. The metallic material can be formed by, for example, CVD, electroplating, and/or other suitable processes to fill the metallic material in the TSV opening(s).

If metal layer 125 is a top metal layer, passivation layer(s), a redistribution layer (RDL, a conductive layer), or a post-passivation interconnect (PPI) layer can be formed over the structure shown in FIG. 4. If the metal layer is a lower metal layer (not top metal layer), dielectric layer(s) and metal layer(s) may be formed over the structure shown in FIG. 4. During the formation of additional dielectric and conductive layers, an additional opening or openings over the TSV structure 25 need to be formed and filled to ensure electrical connection and to provide complete thermal dissipation path. After the front-side processing is completed, the substrate might go through a back-side grinding to thin down substrate 10. During the grinding process the TSV 25 portion embedded in substrate 10 may become exposed.

Figure 5:
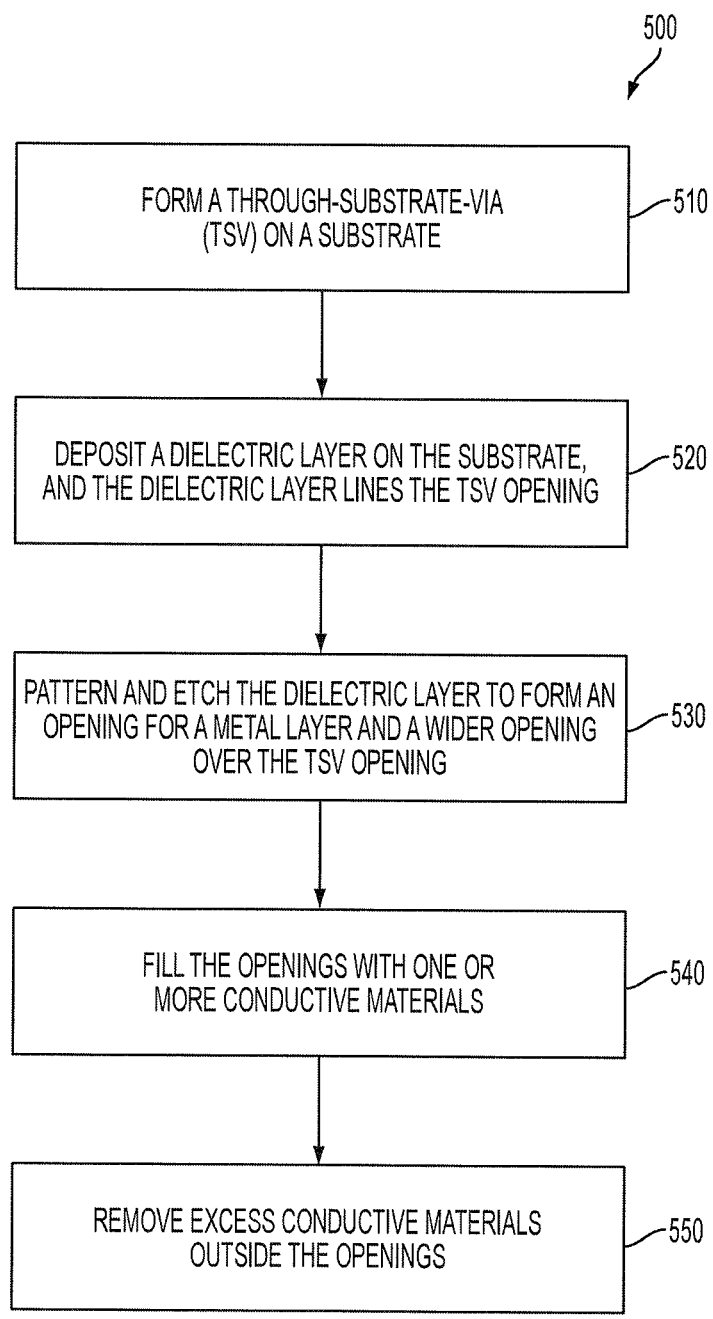
FIG. 5 is a process flow of an exemplary method of forming a semiconductor structure including a TSV structure through a substrate, in accordance with some embodiments.

FIG. 5 is a process flow 500 of an exemplary method of forming a semiconductor structure including a TSV structure through a substrate, in accordance with some embodiments. The TSV formed is similar to TSV 25 described above. At operation 510, a through-substrate-via (TSV, or through-silicon-via) opening is formed in a substrate. The opening is similar to opening 22 on substrate 10. At operation 520, a dielectric layer is deposited over the substrate after operation 510. The deposited dielectric layer is similar to dielectric layer 15 described above, which also lines the TSV opening. The dielectric layer deposited is similar to dielectric layer 15 described above. Afterwards at operation 530, the dielectric layer deposited is patterned and etched to form an opening for a metal layer and a wider opening over the TSV opening. At operation 540, the opening for the metal line and the TSV openings are filled with one or more conductive materials. Afterwards, excess conductive material(s) is removed at operation 550 to form a metal layer and a TSV. The metal layer formed is similar to metal layer 125 and TSV 25.

The embodiments of forming a TSV structure described above enable reducing risk of damaging gate structures due to over polishing of the inter-level dielectric layer (ILD) layer. The TSV structure with a wider opening near one end also enables better gapfill.

In some embodiments, a structure is provided. The structure includes a substrate, a through-substrate-via (TSV) extending into the substrate, and a metal layer formed over the substrate. The metal layer is embedded in a dielectric layer, and the dielectric layer lines the TSV.

In some other embodiments, a structure is provided. The structure includes a substrate and a through-substrate-via (TSV) extending into the substrate. The structure also includes a metal layer formed over the substrate, and the metal layer is embedded in a dielectric layer. The dielectric layer lines the TSV, and the metal layer has a surface substantially at the same level with a surface of the TSV structure. The TSV is wider at the end near the metal layer.

In yet some other embodiments, a method of forming a structure is provided. The method includes forming a through-substrate-via (TSV) opening in a substrate and depositing a dielectric layer on the substrate. The dielectric layer lines the TSV opening. The method also includes patterning and etching the dielectric layer to form an opening for a metal structure and a wider opening at one end of the TSV opening. The method further includes filling the opening for the metal structure and the TSV openings with one conductive material. In addition, the method includes removing excess conductive material from surfaces of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
    a substrate;
    a through-substrate-via (TSV) extending into the substrate;
    a dielectric layer having a first portion that is formed over the substrate and a second portion that lines the TSV, wherein the first portion and the second portion comprise a same material; and
    a metal layer formed over the substrate, wherein the metal layer is embedded in the first portion of the dielectric layer, and wherein the second portion of the dielectric layer terminates at an upper surface inside the TSV, the upper surface below a lower surface of the metal layer, wherein the TSV extends over the upper surface of the second portion of the dielectric layer.

2. The structure of claim 1, wherein the TSV is wider at an end near the metal layer.

3. The structure of claim 1, wherein the upper surface of the second portion of the dielectric layer that lines the TSV is below the lower surface of the metal layer by a thickness in a range from about 2000 Å to about 20,000 Å.

4. The structure of claim 1, wherein the difference of width at one end of the TSV and the other end of the TSV is in a range from about 2000 Å to about 60,000 Å.

5. The structure of claim 1 further comprising an etch stop layer underneath the dielectric layer.

6. The structure of claim 5, wherein the etch stop layer is made of a material selected from the group consisting of silicon nitride, silicon oxynitride, silicon carbide, and a combination thereof, and wherein the thickness of the etch stop layer is in a range from about 100 Å to about 1000 Å.

7. The structure of claim 1, wherein the dielectric layer is made of undoped silicate glass (USG) and has thickness in a range from about 1000 Å to about 30,000 Å.

8. The structure of claim 1, wherein the metal layer is a top metal layer.

9. The structure of claim 1, wherein the structure is part of an interposer and the metal layer is part of an interconnect of the interposer.

10. The structure of claim 1, wherein the substrate has active devices.

11. A structure comprising:
a substrate;
an etch stop layer (ESL) on the substrate;
a through-substrate-via (TSV) extending into the substrate, the TSV extending through the ESL; and
a metal layer formed over the substrate and extending through the ESL, wherein the metal layer is embedded in a dielectric layer, wherein the dielectric layer lines the TSV, wherein the metal layer has an upper surface planarized to an upper surface of a conductive material filled in the TSV, and wherein the TSV is wider at an end near the metal layer, and a top surface the end of the TSV near the metal layer extends above a top surface of the dielectric layer.

12. A method of forming a structure, the method comprising:
forming a through-substrate-via (TSV) opening in a substrate;
depositing a dielectric layer on the substrate, wherein the dielectric layer lines the TSV opening,
patterning and etching the dielectric layer to form an opening for a metal structure and a wider opening at one end of the TSV opening in a first portion of the dielectric layer, and to form a second portion of the dielectric layer in the TSV opening,
filling the opening for the metal structure and the TSV opening with one conductive material, wherein the conductive material in the TSV opening extends over a top surface of the second portion of the dielectric layer closest to the first portion of the dielectric layer; and
removing excess conductive material from surfaces of the dielectric layer, wherein removing excess conductive material comprises planarizing a top surface of the metal structure with a top surface of the wider end of the TSV.

13. The method of claim 12, wherein forming the TSV opening comprises:
depositing an etch stop layer on the substrate;
patterning and etching the substrate to form the TSV opening.

14. The method of claim 12, wherein the wider opening at one end of the TSV opening is wider than the other end by an amount in a range from about 2000 Å to about 60000 Å.

15. The method of claim 12, wherein the opening of the metal structure and the TSV opening are lined by a diffusion barrier layer.

16. The method of claim 12, wherein the dielectric layer that lines the TSV opening is etched to terminate at an upper surface below a lower surface of the metal structure by a thickness in a range from about 2000 Å to about 20,000 Å.

17. The method of claim 12, wherein the excess conductive material is removed by chemical-mechanical polishing, and wherein the metal structure is not a first-level metal to prevent damaging gate structures.

18. The method of claim 12, wherein there is an etch stop layer underneath the dielectric layer, and wherein the etch stop layer is made of a material selected from the group consisting of silicon nitride, silicon oxynitride, silicon carbide, and a combination thereof, and wherein the thickness of the etch stop layer is in a range from about 100 Å to about 1000 Å.

19. The method of claim 12, wherein the dielectric layer is made of undoped silicate glass (USG) and has a thickness in a range from about 1000 Å to about 30,000 Å.

20. The structure of claim 1, further comprising:
an interconnect structure over the substrate, wherein the TSV extends through the interconnect structure, and a top surface of the second portion of the dielectric layer is below a top surface of the interconnect structure.

* * * * *